United States Patent [19]

Haghiri-Tehrani et al.

[11] Patent Number: 5,027,190

[45] Date of Patent: Jun. 25, 1991

[54] CARRIER ELEMENT TO BE INCORPORATED INTO AN IDENTITY CARD

[75] Inventors: Yahya Haghiri-Tehrani, München; Renée-Lucia Barak, Unterhaching, both of Fed. Rep. of Germany

[73] Assignee: GAO Gesellschaft für Automation und Organisation mbH, Fed. Rep. of Germany

[21] Appl. No.: 581,394

[22] Filed: Sep. 12, 1990

Related U.S. Application Data

[63] Continuation of Ser. No. 218,273, Jul. 13, 1988, abandoned.

[30] Foreign Application Priority Data

Jul. 16, 1987 [DE] Fed. Rep. of Germany ....... 3723547

[51] Int. Cl.$^5$ .................... H01L 23/28; H01L 23/12
[52] U.S. Cl. ........................................ 357/74; 357/72; 235/492
[58] Field of Search ................... 357/74, 72; 235/492

[56] References Cited

U.S. PATENT DOCUMENTS

| | | | |
|---|---|---|---|
| 4,216,577 | 8/1980 | Badet et al. | 29/831 |
| 4,222,516 | 9/1980 | Badet et al. | 235/492 |
| 4,649,418 | 3/1987 | Uden | 357/80 |
| 4,701,236 | 10/1987 | Vieilledent | 156/252 |

FOREIGN PATENT DOCUMENTS

| | | | |
|---|---|---|---|
| 3424241 | 1/1985 | Fed. Rep. of Germany | 357/74 |
| 82-00956 | 7/1983 | France | 357/74 |
| 57-207357 | 12/1982 | Japan | 357/74 |

Primary Examiner—Jerome Jackson, Jr.
Attorney, Agent, or Firm—Bacon & Thomas

[57] ABSTRACT

A carrier element is described that has one or more ICs to be incorporated into an identity card or credit card. The carrier element comprises a substrate having on its surface a plurality of contact areas which are connected via connector paths to corresponding terminals of the IC disposed on the substrate. The IC, including the connections to the conductor paths, is protected from mechanical stresses by a cured casting compound. In order to prevent the casting compound from flowing off uncontrollably during its application, an opening is provided in the heat-set adhesive layer applied to one side of the substrate, said opening holding back the liquid resin during its application and acting as a limiting frame. The opening in the adhesive layer is located at least where the IC is to be disposed.

3 Claims, 2 Drawing Sheets

CARRIER ELEMENT TO BE INCORPORATED INTO AN IDENTITY CARD

This application is a continuation of application Ser. No. 07/218,273, filed Jul. 13, 1988, now abandoned.

BACKGROUND OF THE INVENTION

The present invention relates to a carrier element having one or more integrated circuits to be incorporated into an indentity card, comprising a substrate having on its surfaces a plurality of contact areas which are connected via connector paths to the corresponding terminals of an integrated circuit disposed in an opening in the substrate or on the substrate, a casting compound surrounding at least the integrated circuit and protecting it from mechanical stresses, and a frame limiting the casting compound.

Such carrier elements are incorporated, for example, into identity cards, credit cards, accounting cards and the like.

For efficient and thus inexpensive production of these cards, a primary product is preferably used having one or more integrated modules mounted on a carrier provided with conductor paths. During production of the card this so-called "carrier element" is inserted into a matching opening in a card. In order to allow for a sufficiently firm seat of the carrier element in the card opening when incorporated into the card, the carrier element is fixed in the opening with an adhesive.

It is already known in this connection (EP-A1 201 952) to provide carrier elements with a contact adhesive layer for their attachment to an indentity card. Each carrier element consists of a substrate provided with the contact adhesive layer, an IC module on the substrate being connected to contact areas via conductor paths (gold wires). The individual layers of the carrier element are produced from endless films. The contact adhesive layer is provided with a protective layer as usual. The contact adhesive layer and protective layer cover the carrier element except for the area in which the IC module and conductor paths are located. Before the carrier element is incorporated into a card, the protective layer is removed from the contact adhesive layer.

In order to protect the circuit and conductor paths from chemical influences, the carrier elements, while they still exist in an endless format, are sprayed over a large area with a varnish layer that is 10 to 50 microns thick and evenly covers the IC module, the conductor paths and the protective layer.

Using the proposed method, the carrier elements can fundamentally be sprayed only with a very thin varnish layer, since the method involves the varnish layer also covering the protective layer, that is is to be removed subsequently. If the varnish layer is thicker, the removal of the protective layer inevitably damages the varnish layer in the area of the conductor paths and thus the conductor paths themselves.

The known proposal can therefore achieve sufficient protection against chemical influences, but it by no means provides sufficient protection against mechanical stresses for the IC module and conductor paths, which are exposed to frequent bending and compressive stresses both during production and during use of the card. In order to achieve effective mechanical protection in this respect, other measures must therefore be taken.

European laid-open print 0 107 061 describes, for example, a carrier element consisting of a film provided with conductor paths. To allow for the IC module to be contacted using customary wire connections without the required card thickness being exceeded, the IC module is mounted in a punched hole in this film. To protect the elements sensitive to mechanical stresses, an annular limiting body is additionally applied here to the upper side of the film, said body enclosing the IC module and the wire connections and being filled with a resin. After the resin has cured, the upper side of the limiting body is ground off together with the resin compound, to make it possible to obtain the required thickness of the card to be produced.

This known proposal is mainly disadvantageous in terms of an inexpensive production of a carrier element since a frame must be applied in a separate and additional working step to prevent the curing casting compound, that must be applied to the IC module for purposes of protection, from flowing out. On the other hand, a limiting element is necessary for limiting the casting compound to a definite area and allowing it to be applied in a predetermined thickness to the elements to be protected. If there is no limiting element, the casting compound can be applied to the parts to be protected, if at all, only with excessive thickness. Before the carrier element is incorporated into an identity card with a predetermined thickness, the excess casting material must be removed, for example ground off.

BRIEF SUMMARY OF THE INVENTION

The invention is based on the problem of providing a carrier element with an IC module for incorporation into an identity card, which allows for efficient and inexpensive production while providing good protection against mechanical stresses for the sensitive components.

A well tried method for incorporating carrier elements into identity cards consists in connecting the carrier element to the card body with the aid of an adhesive layer.

The main difference between the invention and the stated prior art is that an opening in an adhesive layer, that is required anyway for incorporating a carrier element into an identity card, serves as a frame for the protective casting compound. It has been shown, surprisingly enough, that the limiting function is ensured even in the case of a very thin adhesive layer. This double function of the adhesive layer thus makes it unnecessary to apply a frame additionally, while still allowing for the advantages of the known limiting frames. Due to the cast covering, the IC module, alone or together with the connecting wires, can be protected effectively from mechanical as well as chemical influences, without any need for the additional application of a special limiting frame. Fewer production steps and thus required for producing the carrier element. The exact dosage of the casting compound on the basis of a constant size of the opening (punched hole in the adhesive film) allows, in the one hand, for sparing use of casting compound and, on the other hand, for production of a carrier element having a readily adjustable and constant thickness.

The carrier elements are generally produced from endless films. The various layers of the subsequent carrier elememt are rolled in the form of endless films off various film rolls and united in exact register. For incorporation into an identity card, the carrier elements thus produced need only be punched out of the film laminate and inserted into the card. A production method working on this principle is described, for example, in German laid-open print 36 39 630.

To allow for dosed application of the protective casting compound to the carrier element, it is thus only necessary, when using the known method, to provide the adhesive layer film located on one of the film rolls with a suitable opening at regular intervals. This can be done in a simple manner either beforehand or else in the course of the method described above.

In a preferred embodiment of the invention, the substrate bearing the IC module consists of a synthetic film made of polyester, polyimide or a similar material. The film is covered over its entire surface with a conductive layer out of which the desired contact design is etched. A plurality of openings are provided in the film for the IC module and the leads of the conductor paths to the contact areas. The side of the film opposite the contact areas bears a heat-set adhesive layer which has an opening of a size allowing for free access to the IC module and the openings associated with the contact areas. This freely accessible area is filled with a suitable casting resin, whereby the edge of the opening in the heat-set adhesive layer limits the resin compound during its application in the liquid phase. The type of resin material, the dosage and further parameters known to an expert in this connection are selected so as to ensure that the IC module and conductor paths are safely enclosed, on the one hand, and the overall assembly does not exceed a predetermined thickness, on the other hand.

BRIEF DESCRIPTION OF THE DRAWINGS

Further advantage and developments of the invention are found in the subclaims and the exemplary embodiments, which shall be described in the following with reference to the figures.

FIGS. 1 and 2 show an identity card consisting of a plurality of layers and having a carrier element 11 inplanted in a suitable opening. Contact areas 9 located on the card surface are connected electrically to a circuit 5.

DETAILED DESCRIPTION OF PREFERRED EMBODIMENT

Figure 1:
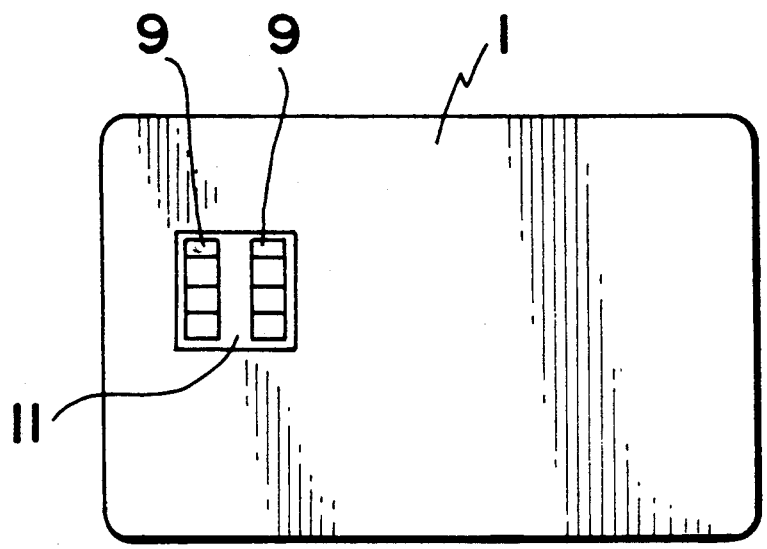
FIG. 1 shows an identity card with an embedded IC module from the top.

In the exemplary embodiment shown, the card comprises a core layer 3 and two cover layers 2 and 4. Carrier element 11 comprises a substrate 8 having on one side contact areas 9 which are connected via conductor paths to an IC module 5 disposed on the side of the substrate opposite the contacts areas. At least IC module 5 is surrounded by a resin drop 10. To allow the carrier element to be embedded in an identity card, the cover and core layers are provided with corresponding openings. The contour of the opening in cover layer 2 is adapted to the size of substrate 8, while the contour of the opening in core layer 3 is adapted to the size of resin drop 10.

The card shown in the figures was laminated using heat and pressure. During the laminating process, the substrate is connected to core layer 3 with the aid of a heat-set adhesive layer 7. If hot laminating is used, core layer 3 may be multilayer as indicated by a broken line in FIG. 2, whereby the layers have openings of different sizes adapted to the shape of resin drop 10. In the finished card the core layers will be immediately adjacent to the resin drop due to the softening during laminating. If other production techniques are used (e.g. the carrier element is incorporated into an already laminated card), a cavity may arise in the area of the resin drop and remain free or else be filled in with a suitable material.

In the case of the latter production method, a heat-set adhesive or a contact adhesive can be used. IC module 5 indicated in resin drop 10 can be connected in various ways to the contact areas of the carrier element.

Figure 2:
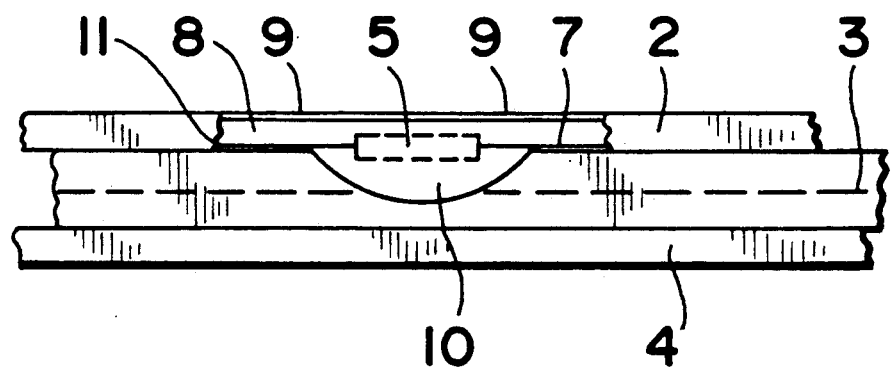
FIG. 2 shows the identity card of FIG. 1 cross-section.
Figure 3:
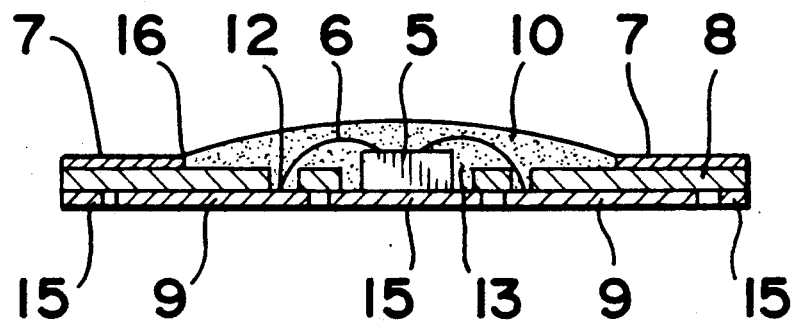
FIG. 3 shows a carrier element in cross-section.
Figure 4:
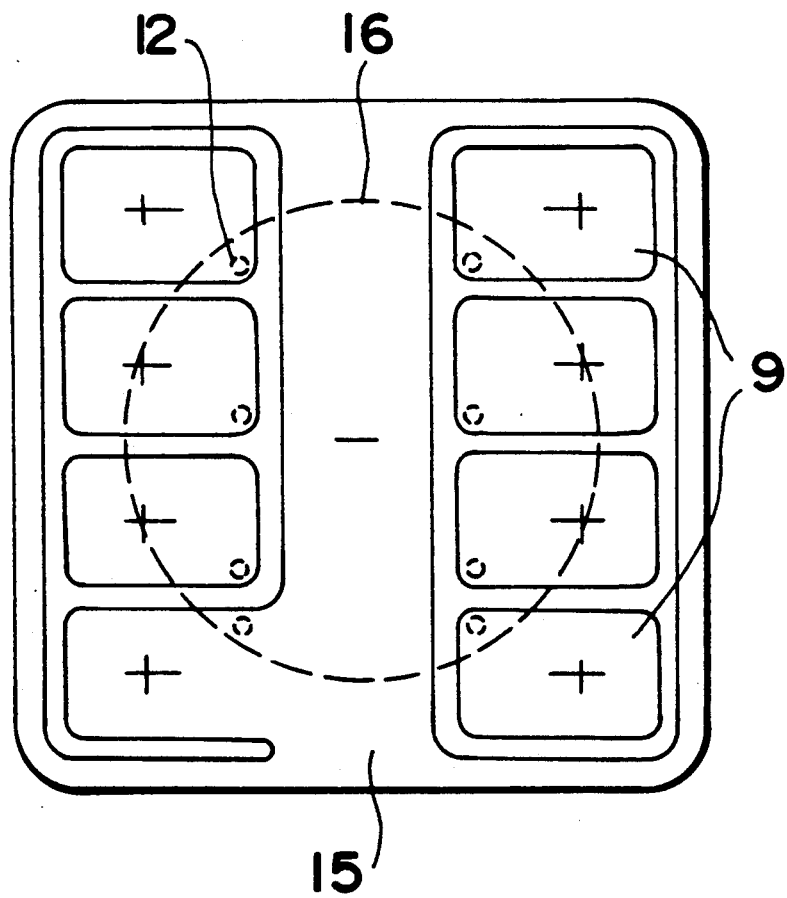
FIG. 4 shows the carrier element of FIG. 3 from the top.

FIGS. 3 and 4 show an exemplary embodiment of carrier element 11 roughly represented in FIG. 2. It consists of three layers: a conductive layer 15 out of which the contact design with contact areas 9 is etched, a substrate 8, for example made of polyimide, and a heat-set adhesive layer 7. Contact areas 9, generally made of copper and preferably covered with a nickel and gold coat, do not touch each other.

In the embodiment shown, IC module 5 is directly connected in an opening 13 in substrate 8 to the conductive layer, for example with the aid of an adhesive.

Further openings 12 in the substrate are placed so as to allow access to contact areas 9, regarded from the side of the carrier element with the IC module on it. Thus, an electrical connection can be easily established between the terminals of IC module 5 and corresponding contact areas 9. In the embodiment shown the so-called "wire bonding technique" was used, whereby fine gold wires 6 establish the electrical connection.

Opening 16 that limits casting compound 10 in heat-set adhesive layer 7 is of a size that casting compound 10 encloses IC module 5, conductor paths 6 and the connecting points in openings 12 between conductor paths 6 and contact areas 9. Opening 16 that limits the casting compound in adhesive layer 7, which prevents the casting compound from flowing off in the liquid phase, may be considerably less thick than the cast covering in the area of the IC module or the connecting wires. The casting compound used is preferably a curing resin. The viscosity and amount of the casting compound are set so that the desired overall thickness of the carrier element is not exceeded but, on the other hand, all sensitive elements and connecting points are protected within the casting compound. The superficial extent of the cast covering is dependent on the positions of openings 12 and the connected conductor paths to the contact areas. One will therefore dispose openings 12 as close as possible to IC module 5 so that opening 16 in adhesive layer 7 is accordingly small and the remaining adhesive surface is as large as possible.

The heat-set adhesive layer used in the described embodiment can also be applied together with a protective layer which is removed before or after application of the casting compound. This guarantees a clean adhesive surface in a simple way during production of the carrier elements.

We claim:

1. An identity card comprising a carrier element including a substrate having at least one aperture; an integrated circuit including at least one terminal and disposed in said aperture; at least one connector path on at least a first surface of the substrate connected to the at least one terminal of the integrated circuit; a heat activatable adhesive film layer disposed on and in direct contact with a second surface of the substrate opposite said first surface; said film surrounding said substrate aperture at a distance therefrom and defining by its thickness a barrier frame adjacent and surrounding said substrate aperture; a casting compound surrounding at least said integrated circuit and extending along said second surface only up to the adhesive film barrier frame; and a core layer including a core surface portion adhesively bonded to said second surface by said adhesive film.

2. An identity card as claimed in claim 1, further comprising a cover layer including a cover layer opening surrounding said carrier element and said adhesive film, said cover layer being adhered to said core layer.

3. An identity card as claimed in claim 1, wherein said at least one terminal is disposed on the side of the integrated circuit facing away from said first surface of the substrate; and at least one electrical lead extending from the terminal to the connector path through the substrate thickness; said casting compound surrounding at least said integrated circuit, said terminal and said lead to protect same from mechanical stresses.

* * * * *